(12) United States Patent
Tanaka et al.

(10) Patent No.: US 7,634,026 B2
(45) Date of Patent: Dec. 15, 2009

(54) RECEIVING METHOD AND RECEIVING APPARATUS

(75) Inventors: Yasuhiro Tanaka, Aichi (JP); Seigo Nakao, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 584 days.

(21) Appl. No.: 11/362,107

(22) Filed: Feb. 27, 2006

(65) Prior Publication Data
US 2006/0193394 A1    Aug. 31, 2006

(30) Foreign Application Priority Data
Feb. 28, 2005    (JP)    ............... 2005-055142

(51) Int. Cl.
*H04L 27/00* (2006.01)
*H03K 9/00* (2006.01)

(52) U.S. Cl. .................. 375/316; 375/147; 375/340; 375/345; 375/354

(58) Field of Classification Search ................. 375/316, 375/147, 340, 345, 354
See application file for complete search history.

(56) References Cited

U.S. PATENT DOCUMENTS

| 7,356,110 | B2 * | 4/2008 | Lopez et al. | ................. 375/375 |
| 7,453,955 | B2 * | 11/2008 | Doi | ............................. 375/316 |
| 2005/0129151 | A1 * | 6/2005 | Kobayashi et al. | .......... 375/345 |
| 2005/0220222 | A1 * | 10/2005 | Marsili | ....................... 375/320 |

FOREIGN PATENT DOCUMENTS

| JP | 11-145932 | 5/1999 |
| JP | 2004-064525 | 2/2004 |

OTHER PUBLICATIONS

Japanese Office Action, with English Translation, issued in corresponding Japanese Patent Application No. JP, 2005-055142, dated on Jun. 22, 2007.
International Search Report and Written Opinion of the International Searching Authority, with English translation, issued in International Application No. PCT/JP2006/302851, mailed Sep. 20, 2007.
Coleri et al., "Channel Estimation Techniques Based on Pilot Arrangement in OFDM Systems", IEEE Transactions of Broadcasting, vol. 48, No. 3, Sep. 2002 pp. 223-229.
Yasutaka Ogawa, et al., "A Mimo-Ofdm System for High-SpeedTransmission", Oct. 9, 2003, pp. 493-497, vol. 1 Search Report dated May 8, 2006.

* cited by examiner

*Primary Examiner*—Ted M Wang
(74) *Attorney, Agent, or Firm*—McDermott will & Emery LLP

(57) ABSTRACT

Burst signals are received. An AGC unit determines gain for the received burst signal. A VGA unit amplifies the received burst signal by the determined gain. In the burst signal, Legacy STS is assigned in a header portion and MIMO-STS is assigned posterior to the Legacy STS. The AGC unit determines a tentative gain in Legacy STS. The tentative gain is then reduced. With the reduced tentative gain as an initial value, the gain is determined in MIMO-STS.

14 Claims, 11 Drawing Sheets

FIG.3

| Legacy STS | Legacy LTS | Legacy SIGNAL | MIMO SIGNAL | 1ST MIMO-STS | 1ST MIMO-LTS | 1ST DATA |
|---|---|---|---|---|---|---|
| Legacy STS+CDD | Legacy LTS+CDD | Legacy SIGNAL+CDD | MIMO SIGNAL +CDD | 2ND MIMO-STS | 2ND MIMO-LTS | 2ND DATA |

FIG.7

| NUMBER OF STREAMS | REDUCTION AMOUNT |
|---|---|
| 2 | 3dB |
| 3 | 5dB |
| 4 | 6dB |

78

RECEIVING METHOD AND RECEIVING APPARATUS

BACKGROUND OF THE INVENTION

1. Field of the Invention

The present invention relates to the receiving technologies, and it particularly relates to method and apparatus for determining the gain from the received signals and amplifying the received signals by the determined gain.

2. Description of the Related Art

An OFDM (Orthogonal Frequency Division Multiplexing) modulation scheme is one of multicarrier communication schemes that can realize the high-speed data transmission and are robust in the multipath environment. This OFDM modulation scheme has been used in the wireless LAN (Local Area Network) standards such as IEEE802.11a/g and HIPERLAN/2. The burst signals in such a wireless LAN are generally subject to the effect of frequency selective fading. Hence, a receiving apparatus generally carries out the channel estimation dynamically.

In order for the receiving apparatus to carry out the channel estimation, two kinds of known signals are provided within a burst signal. One is the known signal, provided for all carriers in the beginning of the burst signal, which is the so-called preamble or training signal. The other one is the known signal, provided for part of carriers in the data area of the burst signal, which is the so-called pilot signal (See Reference (1) in the following Related Art List, for instance).

Related Art List (1) Sinem Coleri, Mustafa Ergen, Anuj Puri and Ahmad Bahai, "Channel Estimation Techniques Based on Pilot Arrangement in OFDM Systems", *IEEE Transactions on broadcasting*, vol. 48, No. 3, pp. 223-229, September 2002.

In wireless communications, adaptive array antenna technology is one of the technologies to realize the effective utilization of frequency resources. In adaptive array antenna technology, the amplitude and phase of signals transmitted from and received by a plurality of antennas, respectively, are so controlled as to form a directional pattern of the antenna. Hereinafter, such a directivity pattern will be referred to as "adaptive pattern". One of techniques to realize higher data transmission rates by using such an adaptive array antenna technology is the MIMO (Multiple-Input Multiple-Output) system. In this MIMO system, a transmitting apparatus and a receiving apparatus are each equipped with a plurality of antennas, and a channel corresponding to each of the plurality of antennas is set. That is, channels up to the maximum number of antennas are set for the communications between the transmitting apparatus and the receiving apparatus so as to improve the data transmission rates. Moreover, combining this MIMO system with a technique such as the OFDM modulation scheme results in a higher data transmission rate.

The combination of antenna directivity patterns in the transmitting apparatus and the receiving apparatus in the MIMO system may be expressed as follows, for example. One case is that the antenna of the transmitting apparatus has an omni pattern whereas the antenna of the receiving apparatus has an adaptive pattern. Another case is that both the antenna of the transmitting apparatus and the antenna of the receiving apparatus have adaptive patterns. The system can be more simplified if the former is used whereas the antenna directivity pattern is controlled in a more detailed manner in the latter and therefore the characteristics thereof can be improved. In either case, when the receiving apparatus receives data, the gain needs to be controlled by AGC (Automatic Gain Control) before the aforementioned channel estimation is executed. For the control of gain, a known signal for use with AGC is generally assigned prior to a known signal for use in channel estimation, in a burst signal.

In the foregoing circumstances, the inventor came to recognize the following problems to be solved. In order to realize the coexistence of a system which is not compatible with MIMO (hereinafter referred to as "Legacy system") and a MIMO system, each burst signal is such that a signal compatible with a MIMO system is assigned posterior to a signal compatible with a Legacy system. The signal compatible with a Legacy system is a signal which can be received even by a receiving apparatus in a Legacy system whereas the signal compatible with a MIMO system is a signal to be received by a receiving apparatus compatible with a MIMO system. In the above arrangement, the known signals for use with AGC are assigned in the beginning stages of the respective signals. That is, a known signal, for use with AGC, which is compatible with a MIMO system is placed posterior to a known signal, for use with AGC, which is provided for a Legacy system.

In the receiving apparatus, the gain determined by the known signal, for use with AGC, which is provided for a Legacy system differs generally from the gain determined by the known signal, for use with AGC, which is compatible with a MIMO system. In particular, when beamforming is performed on the signal compatible with a MIMO system, the difference therebetween becomes larger. In order for the receiving apparatus to receive the signals compatible a MIMO system under such a circumstance, a gain in response to the beamformed signals is required. However, if the period of a known signal in the beamformed signals is short, the error contained in the gain determined by the receiving apparatus becomes larger.

SUMMARY OF THE INVENTION

The present invention has been made in view of the foregoing circumstances and an objective thereof is to provide a receiving technique by which the error contained in a determined gain is reduced.

In order to solve the above problems, a receiving apparatus comprises: a receiver which receives a burst signal; a decision unit which determines a gain for the burst signal received by the receiver; an amplifier which amplifies the burst signal received by the receiver, by the gain determined by the decision unit; and a processing unit which processes the burst signal amplified by the amplifier. In the burst signal received by the receiver, a first known signal is assigned in a header portion whereas a second known signal is assigned posterior to the first known signal, and the decision unit includes a means which determines a tentative gain in the first known signal, a means which reduces said tentative gain, and a means which determines a gain in the second known signal with the reduced tentative gain as an initial value.

According to this embodiment, the tentative gain is reduced and then a gain is determined with the tentative gain as an initial value. As a result, the signals are unlikely to saturate at the time of determining the gain. Hence, the change in signal can be accurately detected and the error contained in gain can be reduced.

The receiver receives burst signals by a plurality of antennas, the burst signal is composed of a plurality of streams, and at the same time a cross-correlation among the second known signals assigned respectively to the plurality of streams may be so defined as to be smaller than a cross-correlation among the first known signals assigned respectively to the plurality of streams; the decision unit may determine a gain for the burst signals received by the receiver via the plurality of antennas; and the amplifier may amplify the burst signals received by the receiver via the plurality of antennas. In this case, since the cross-correlation among the second known signals is so defined as to be smaller than the cross-correlation among the first known signals assigned respectively to the plurality of streams, the error contained in the tentative gain determined by the first known signal can be reduced by the second known signal.

The receiver receives burst signals by a plurality of antennas, at least a second known signal and a signal posterior thereto in the burst signals are each composed of a plurality of streams, and at the same time the second known signal and the signal posterior thereto may be beamformed; the decision unit may determine a gain for the burst signals received by the receiver via the plurality of antennas; and the amplifier may amplify the burst signals received by the receiver via the plurality of antennas. In this case, even in the case where beamforming is performed on the second known signal and signals placed posterior thereto, the possibility that the signals saturate can be lowered by reducing the tentative gain and thereby the error contained in the gain can be made smaller.

The receiver may receive beforehand a signal containing information indicative of a schedule of beamforming execution; and when the signal containing information indicative of a schedule of beamforming is received by the receiver, the decision unit may reduce the tentative gain. In this case, the execution of beamforming is detected by the time the beamforming starts, so that the tentative gain can be reduced.

Information indicative of a schedule of beamforming execution may be assigned between the first known signal and the second known signal, in the burst signal received by the receiver via the plurality of antennas; and when beamforming execution is detected from the information, the decision unit may reduce the tentative gain. In this case, the execution of beamforming is detected by the time the beamforming starts, so that the tentative gain can be reduced.

The receiving apparatus may further comprise an acquiring unit which acquires the number of a plurality of streams, wherein the decision unit may determine a degree of reducing the tentative gain, in accordance with the number of a plurality of streams acquired by the acquiring unit. In this case, the larger the number of streams, more likely that the signal strength increases, so that the accuracy of the initial value can be enhanced.

Another embodiment according to the present invention relates to a receiving method. This is a method in which a gain for burst signal received is determined and the received burst signal is amplified by the determined gain and thereafter the amplified burst signal is processed. This method is characterized in that in the received burst signal a first known signal is assigned in a header portion thereof, a second known signal is assigned posterior to the first known signal, a tentative gain is determined in the first known signal, said tentative gain is reduced and a gain is determined in the second known signal with the reduced tentative gain as an initial value.

Still another embodiment according to the present invention relates also to a receiving method. This method includes: receiving a burst signal; determining a gain for the burst signal received; amplifying the received burst signal by the gain determined by the determining; and processing the burst signal amplified by the amplifying. In the burst signal received in the receiving, a first known signal is assigned in a header portion whereas a second known signal is assigned posterior to the first known signal, and the determining includes: determining a tentative gain in the first known signal; reducing the tentative gain; and determining a gain in the second known signal with the reduced tentative gain as an initial value.

The receiving may be such that burst signals are received by a plurality of antennas, the burst signal is composed of a plurality of streams, and at the same time a cross-correlation among the second known signals assigned respectively to the plurality of streams may be so defined as to be smaller than a cross-correlation among the first known signals assigned respectively to the plurality of streams; in the determining a gain for the burst signals received by the plurality of antennas may be determined; and in the amplifying the burst signals received by the plurality of antennas may be amplified.

The receiving may be such that burst signals are received by a plurality of antennas, at least a second known signal and a signal posterior thereto in the burst signals are each composed of a plurality of streams, and at the same time the second known signal and the signal posterior thereto are beamformed; in the determining a gain for the burst signals received by the plurality of antennas may be determined; and in the amplifying the burst signals received by the plurality of antennas may be amplified.

The receiving may receive beforehand a signal containing information indicative of a schedule of beamforming execution, and when the signal containing information indicative of a schedule of beamforming is received, the determining may reduce the tentative gain. Information indicative of a schedule of beamforming execution may be assigned between the first known signal and the second known signal, in the burst signal received in the receiving via the plurality of antennas; and when beamforming execution is detected from the information, the determining may reduce the tentative gain. The receiving method may further comprise acquiring the number of a plurality of streams, wherein the determining may determine a degree of reducing the tentative gain, in accordance with the number of a plurality of streams acquired in the acquiring.

Data may be composed of a plurality of streams. A known signal may be composed of a plurality of streams. A control signal may be composed of a plurality of streams.

It is to be noted that any arbitrary combination of the above-described structural components and expressions changed among a method, an apparatus, a system, a recording medium, a computer program and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 3 illustrates a structure of burst format in the communication system of FIG. 2.

FIG. 7 shows a data structure of a table stored in an AGC unit of FIG. 6.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

Before describing the present invention in detail, an outline of the present invention will be described first. Embodiments of the invention relates to a receiving apparatus in a MIMO system. The receiving apparatus receives burst signals in a MIMO system. Here, a burst signal in a MIMO system is such that a signal compatible with a legacy system is assigned in a front stage whereas a signal compatible with a MIMO system is assigned in a subsequent stage. A burst signal is comprised of a plurality of streams. A known signal for AGC is assigned in a front stage of the signal compatible with the legacy system (hereinafter such a known signal will be referred to as "legacy known signal") whereas a known signal for AGC is assigned in a front stage of the signal compatible with the MIMO system (hereinafter such a known signal will be referred to as "MIMO known signal"). When the receiving apparatus receives such burst signal, a gain determined based on a legacy known signal and a gain determined based on a MIMO known signal differ from each other.

In particular, if part of the signal compatible with a MIMO system is beamformed, the strength of a signal compatible with a MIMO becomes larger than the strength of a signal compatible with a legacy system. In such a case, if the signal compatible with a MIMO system is amplified by a gain determined based on a legacy known signal, it is possible that an overflow occurs in the signal compatible with a MIMO. Generally, the signal strength varies according to the number of streams in a MIMO system. Thus, it is preferred that the use of a gain determined based on a MIMO known signal be used to receive signals compatible with a MIMO system. However, since an interval of the MIMO known signal is specified such that it is shorter than that of the legacy known signal, the error contained in a gain determined tends to be larger.

A receiving apparatus according to an embodiment determines a tentative gain, based on a legacy known signal. While using the thus determined tentative gain, the receiving apparatus receives signals compatible with a legacy system. The receiving apparatus acquires the number of streams used in a MIMO system, and reduces the tentative gain in accordance with the acquired number of streams. For example, when the number of steams is "2", the tentative gain is reduced by "3 dB" whereas when the number of streams is "3", the tentative gain is reduced by "5 dB". With the thus reduced tentative gain as an initial value, the receiving apparatus determines a gain based on a MIMO known signal. Finally, the receiving apparatus receives signals compatible with a MIMO, while using the thus determined gain.

Figure 1:
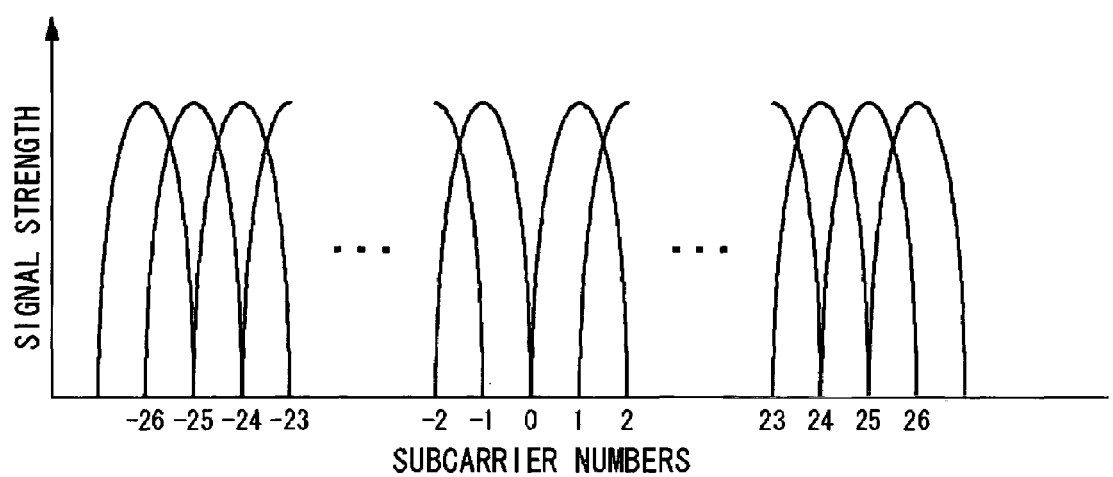
FIG. 1 illustrates a spectrum of a multicarrier signal according to an embodiment of the present invention.

FIG. 1 illustrates a spectrum of a multicarrier signal according to an embodiment of the present invention. In particular, FIG. 1 shows a spectrum of a signal in the OFDM modulation scheme. One of a plurality of carriers in an OFDM modulation scheme is generally called a subcarrier. Herein, each of the subcarriers is designated by a "subcarrier number". Similar to the IEEE802.11a standard, 53 subcarriers, namely, subcarrier numbers "−26" to "26" are defined herein. It is to be noted that the subcarrier number "0" is set to null so as to reduce the effect of a direct current component in a baseband signal. The respective subcarriers are modulated by a modulation scheme which is set variably.

Used here as a modulation scheme is any one of BPSK (Binary Phase-Shift Keying), QPSK (Quadrature Phase-Shift Keying), 16QAM (Quadrature Amplitude Modulation), 64QAM and 256QAM. Convolutional coding is applied, as an error correction scheme, to these signals. The coding rates for the convolutional coding are set to 1/2, 3/4 and so forth. The number of antennas used in a MIMO system is set variably. As a result, when the mode of modulation scheme and the values of coding rate and the number of antennas are set variably, the data rate is also set variably. In order to make clear distinction from the number of antennas in a receiving apparatus, it is assumed herein that the number of data transmitted from a transmitting apparatus in parallel is called the number of "streams".

Figure 2:
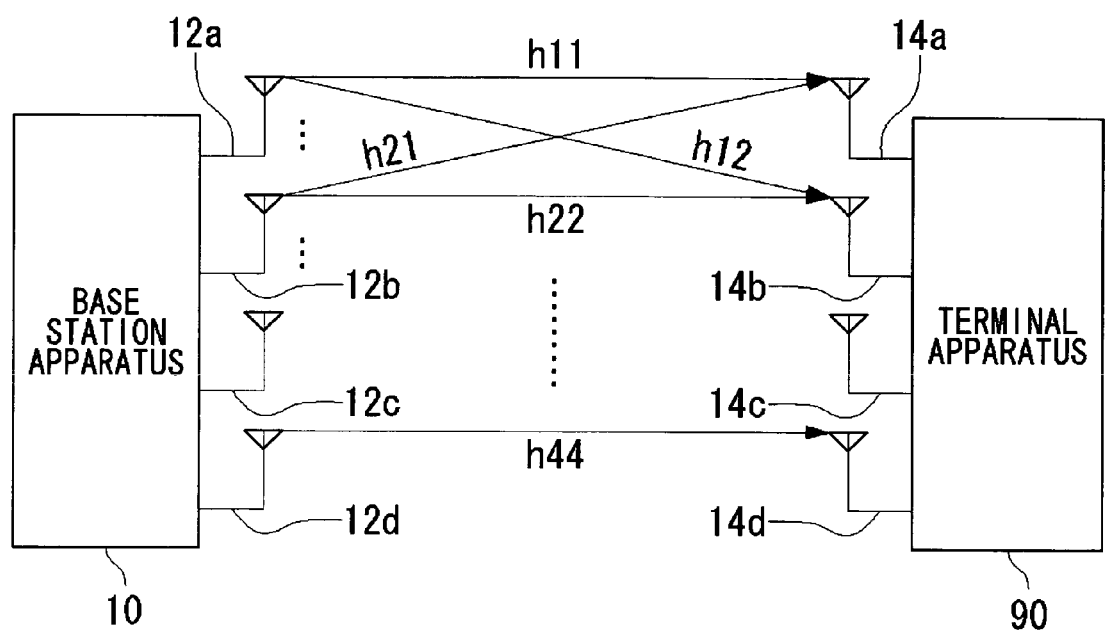
FIG. 2 illustrates a structure of a communication system according to an embodiment of the present invention.

FIG. 2 illustrates a structure of a communication system 100 according to an embodiment of the present invention. The communication system 100 includes a base station apparatus 10 and a terminal apparatus 90. The base station apparatus 10 includes a first antenna 12a, a second antenna 12b, a third antenna 12c and a fourth antenna 12d, which are generically referred to as "antennas 12", and the terminal apparatus 90 includes a first antenna 14a, a second antenna 14b, a third antenna 14c and a fourth antenna 14d, which are generically referred to as "antennas 14".

Before describing a structure of the communication system 100, an outline of a MIMO system will be explained first. Assume here in the description of the downlink that data are being transmitted from the base station apparatus 10 to the terminal apparatus 90. The base station apparatus 10 transmits different data from the first antenna 12a to fourth antenna 12d, respectively. Here, data of four streams are transmitted. As a result, the data rate becomes higher. The terminal apparatus 90 receives the data by the first antenna 14 to fourth antenna 14d. The terminal apparatus 90 demodulates independently the data transmitted from the first antenna 12a to fourth antenna 12b by using the adaptive array signal processing.

Here, since the number of antennas 12 is "4" and the number of antennas 14 is also "4", the number of combinations of channels between the antennas 12 and the antennas 14 is "16". The channel characteristic between from the ith antenna 12i to the jth antenna 14j is denoted by $h_{ij}$. In FIG. 2, the channel characteristic between the first antenna 12a and the first antenna 14a is denoted by $h_{11}$, that between the first antenna 12a and the second receiving antenna 14b by $h_{12}$, that between the second antenna 12b and the first antenna 14a by $h_{21}$, that between the second antenna 12b and the second antenna 14b by $h_{22}$, and that between the fourth antenna 12d and the fourth antenna 14d by $h_{44}$. For the clarity of illustration, it is omitted to show the other channels in FIG. 2.

The terminal apparatus 90 operates so that data transmitted from the first antenna 12a to the fourth antenna 12d, respectively, are demodulated independently by adaptive array signal processing. The base station apparatus 10 also performs adaptive array signal processing on the first antenna 12a to fourth antenna 12d. In this manner, the adaptive array signal processing is performed also at the transmitting side, namely, by the base station apparatus 10, so that the space division in a MIMO system is ensured. As a result, the interference among signals transmitted by a plurality of antennas 12 becomes smaller, so that the communication quality can be improved in the present embodiments. It is to be noted that the operations of the base station apparatus 10 and the terminal apparatus 90 may be reversed.

FIG. 3 illustrates a structure of burst format in a communication system 100. FIG. 3 shows a burst format when the number of streams is "2". The top row in FIG. 3 corresponds to a first stream whereas the bottom row a second stream. "Legacy STS (Short Training Sequence)", "Legacy LTS (Long Training Sequence)" and "Legacy SIGNAL" are signals compatible with a legacy communication system, such as a wireless LAN system that conforms to the IEEE802.11a standard which is not compatible with a MIMO. "Legacy STS+CDD" corresponds to a signal in which CDD (Cyclic Delay Diversity) is performed on "Legacy STS". The same is also applied to "Legacy LTS+CDD" and "Legacy SIGNAL+CDD". CDD is denoted by C and is such a processing as expressed by the following Equation (1).

$$C(\lambda)=\text{dia}(1, \exp(-j2\pi\lambda\delta/N\text{out}),\Lambda, \exp(-j2\pi\lambda\delta(N\text{out}-1)/N\text{out})) \quad (1)$$

where δ indicates a shift amount.

"Legacy STS" is used for AGC setting, timing synchronization and the like, "legacy LTS" is used for the estimation of channel characteristics, and "Legacy SIGNAL" contains control information. "Legacy STS" is equivalent to the aforementioned legacy known signal. Signals placed posterior to "MIMO SIGNAL" (inclusive) are those characteristic of a MIMO system, and "MIMO SIGNAL" and "MIMO SIGNAL+CDD" contain control information compatible with a MIMO system. "First MIMO-STS" and "Second MIMO-STS" are used for AGC setting, timing synchronization and the like. "First MIMO-LTS" and "Second MIMO-LTS" are used for the estimation of channel characteristics. "First DATA" and "Second DATA" are data to be transmitted. "First MIMO-STS" and "Second MIMO-STS" are equivalent to the aforementioned MIMO known signals. Hereinafter, "First MIMO-STS" to "Second MIMO-STS" are generically referred to as "MIMO STS" or "MIMO-STSs", "Second MIMO-LTS" to "Second MIMO-LTS" are generically referred to as "MIMO-LTS" or "MIMO-LTSs", and "First DATA" and "Second DATA" are generically referred to as "DATA".

Here, "First MIMO-STS" and "Second MIMO-STS" are composed of such patterns that mutual interference becomes small. The same is applied to the case where MIMO-STSs are assigned respectively to three or more streams. In order to explain a problem to be solved when "First MIMO-STS" and "Second MIMO-STS" are set identical to each other, a phenomenon that occurs when "Legacy STS" is assigned to two streams will now be explained. If "Legacy STS" assigned in the first stream is denoted by $S_1(t)$, "Legacy STS" assigned in the second stream is $S_2(t)$ and the nose is $n_1(t)$ and $n_2(t)$, then $X_1(t)$ which is "Legacy STS" received by a first antenna and $X_2(t)$ which is "Legacy STS" received by a second antenna will be expressed respectively as:

$$X_1(t)=h_{11}S_1(t)+h_{21}S_2(t)+n_1(t)$$

$$X_2(t)=h_{12}S_1(t)+h_{22}S_2(t)+n_2(t) \quad (2)$$

The strength of "legacy STS", received by the first antenna, in unit of 16 FFT points is expressed as follows:

$$\sum |X_1(t)|^2 = \sum X_1(t)X_1^*(t) \quad (3)$$
$$= \sum (h_{11}S_1(t) + h_{21}S_2(t) + n_1(t))$$
$$\{h_{11}^*S_1^*(t) + h_{21}^*S_2^*(t) + n_1^*(t)\}$$
$$= h_{11}h_{11}^*\sum S_1(t)S_1^*(t) + h_{21}h_{21}^*\sum S_2(t)S_2^*(t) +$$
$$h_{11}h_{21}^*\sum S_1(t)S_2^*(t) + h_{11}^*h_{21}\sum S_1^*(t)S_2(t) +$$
$$h_{11}\sum S_1(t)n_1^*(t) + h_{21}\sum S_2(t)n_1^*(t) +$$
$$h_{11}^*\sum S_1^*(t)n_1(t) + h_{21}^*\sum S_2^*(t)n_1(t) +$$
$$\sum n_1(t)n_1^*(t)$$

Using the realtions $\sum S_1^*(t)S_2(t) = Xc$, $$\sum S_i^*(t)n_j(t) = 0$$

and $|n_j(t)|^2 \approx 0$, the strength is expressed by:

$$\sum |X_l(t)|^2 = |h_{11}|^2 + |h_{21}|^2 + h_{11}h_{21}^*Xc^* + h_{11}^*h_{21}Xc \quad (4)$$
$$= |h_{11}|^2 + |h_{21}|^2 + 2Re[h_{11}h_{21}^*Xc^*]$$

When the transmitted "Legacy STS", namely, $S_1(t)$ and $S_2(t)$ are equal to each other and in addition $h_{11}=-h_{21}$, the strength of received "Legacy STSs" is zero, so that the AGC cannot function accurately. Furthermore, since Xc in the DATA interval becomes generally so small as can be regarded as zero, the received strength in the DATA interval becomes $|h_{11}|^2+|h_{22}|^2$. Hence, the difference in received strength between the DATA interval and the STS interval is $2Re[h_{11}h_{21}*Xc*]$. This indicates that the AGC does not function normally if Xc in the STS interval is large and consequently there is a large difference in strength between the STS interval and the DATA interval even if $S_1(t)$ and $S_2(t)$ are not equal. Therefore, an STS different from the STS of the IEEE802.11a standard is required for the MIMO system and the cross-correlation value between them is desired to be low.

Figure 4:
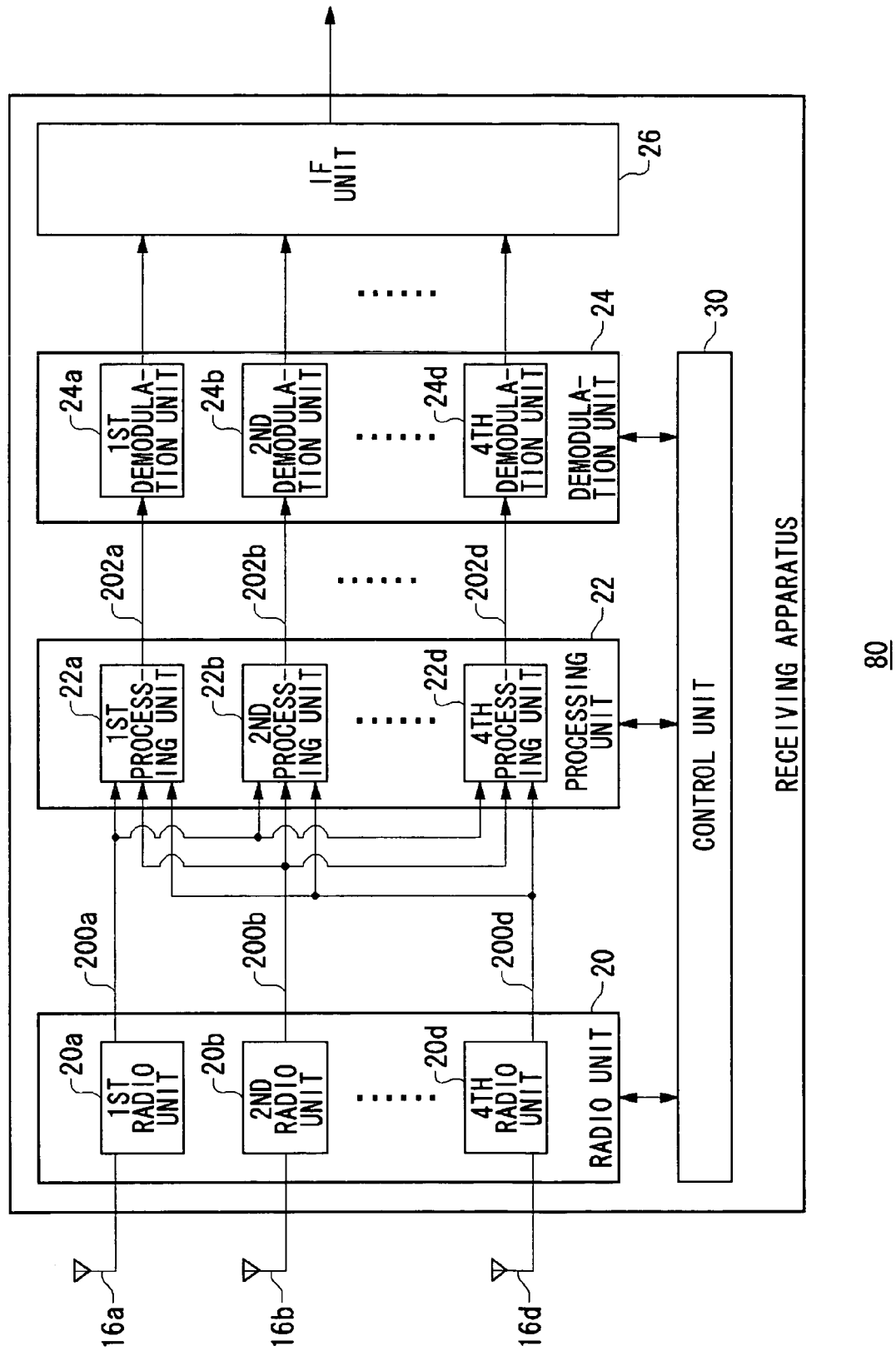
FIG. 4 illustrates a structure of a receiving apparatus in the communication system of FIG. 2.

FIG. 4 illustrates a structure of a receiving apparatus 80 in a communication system 100. The receiving apparatus 80, which is contained in the base station apparatus 10 or the terminal apparatus 90 shown in FIG. 2, is configured by extracting receiving function therefrom. For this reason, the receiving apparatus 80 may correspond to the base station apparatus 10 or the terminal apparatus 90. The receiving apparatus 80 includes a first antenna 16a, a second antenna 16b, . . . and a fourth antenna 16d, which are generically referred to as "antenna 16", a first radio unit 20a, a second radio unit 20b, . . . and a fourth radio unit 20d, which are generically referred to as "radio unit 20", a first processing unit 22a, a second processing unit 22b, . . . and a fourth processing unit 22d, which are generically referred to as "processing unit 22", a first demodulation unit 24a, a second demodulation unit 24b, . . . and a fourth demodulation unit 24d, which are generically referred to as "demodulation unit 24", an IF unit 26 and a control unit 30. Signals involved include a first time-domain signal 200a, a second time-domain signal 200b, . . . and a fourth time-domain signal 200d, which are generically referred to as "time-domain signal 200", and a first frequency-domain signal 202a, a second frequency-domain signal 202b, . . . and a fourth frequency-domain signal 202d, which are generically referred to as "frequency-domain signal 202".

The radio unit 20 carries out frequency conversion of radio-frequency burst signals received by a plurality of antennas 16 so as to derive baseband burst signals. The radio unit 20 outputs the baseband burst signals to the processing unit 22 as the time-domain signals 200. The baseband signal, which is composed of in-phase components and quadrature components, shall generally be transmitted through two lines. For the clarity of figure, the signal is presented here by a signal signal line. The format of burst signals processed by the radio unit 20 is as shown in FIG. 3. That is, "Legacy STS" is placed in a header portion of a burst signal, followed by "MIMO-STS".

The burst signal is composed of a plurality of streams. At the same time the burst signal is so defined that the cross-correlation among "MIMO-STSs" assigned respectively to the plurality of streams is smaller than the cross-correlation among "Legacy STSs" assigned respectively to the plurality of streams. For example, "First MIMO-STS" and "Second MIMO-STS" are so defined as to use different subcarriers. As described earlier, "Legacy STS" and "Legacy STS+CDD" are so related to each other that the latter is subjected to CDD, but are so defined that the both use the same subcarriers. Hence it can be said that they are so defined that the cross-correlation of the former is smaller than the cross-correlation of the latter. In the burst signal, "MIMO-STS", "MIMO-LTS" and "DATA" have undergone beamforming by a transmitting apparatus (not shown). Since the beamforming is a conventional technology, the explanation thereof is omitted here.

"MIMO SIGNAL", place between "Legacy STS" and "MIMO-STS", in the burst signal contains information indicative of a schedule of beamforming execution. That is, "MIMO SIGNAL" contains information that indicates whether or not the beamforming has been executed in a subsequent stage of "MIMO SIGNAL". When said information is detected, the control unit 30 described later recognizes the execution of beamforming. "MIMO SIGNAL" also contains information on the number of streams on which beamforming has been performed. The control unit 30 described later recognizes the number of streams by detecting said number.

The radio unit 20 includes an AGC unit by which a gain for the received burst is determined. When the burst signal undergoes the beamforming, the gain is determined by the following three-stage processing, for example. In a first stage, a tentative gain is determined in "Legacy STS". In a second stage, the determined tentative gain is reduced. In a third stage, a gain is determined in "MIMO-STS" with the reduced tentative gains as an initial value. A plurality of radio units 20 measure the strengths of inputted burst signals, respectively, and the control unit 30 selects a radio unit 20 that corresponds to the maximum strength. The AGC unit contained in the selected radio unit 20 carries out the first- to third-stage processings. As a result, the determined gain is outputted, as a gain in a plurality of AGC units, to the remaining radio units 20.

When, in particular, the execution of beamforming is detected from the aforementioned information, the second-stage processing is carried out. Accordingly, when the execution of beamforming is not detected, the tentative gain determined in the first stage may be directly used as the gain or the third stage may be carried out such that the tentative gain determined in the first stage is used as an initial value. The AGC unit included in the radio unit 20 receives, from the control unit 30, the number of streams detected by the control unit 30. In the AGC unit, the correspondence between the number of streams and the reduction amount of the tentative gain is defined beforehand. For example, the correspondence is defined as in the following cases (1), (2) and (3) where when "the number of streams is 2", "the reduction amount is 3 dB"; (2) when "the number of streams is 3", "the reduction amount is 5 dB"; and (3) when "the number of streams is 4", "the reduction amount is 6 dB". In the second stage, the AGC unit specifies a reduction amount from the number of streams. The AGC unit uses the specified reduction amount to reduce the tentative gain. The radio unit 20 amplifies a plurality of burst signals by the determined gain.

The processing unit 22 converts a plurality of time-domain signals into the frequency-domain signals, respectively, and performs adaptive array signal processing on the thus converted frequency-domain signals. The processing unit 22 outputs the adaptive array signal processing result as the frequency-domain domain signals 202. Each frequency-domain signal 202 corresponds to each stream signal contained in a burst signal. It is assumed here that a plurality of time-domain signals are the burst signals amplified by the radio units 20. It is assumed herein that the frequency-domain signal 202, which is a signal in the frequency domain, contains a plurality of subcarrier components as shown in FIG. 1. For the clarity of figure, the frequency-domain signal is arranged in the order of the subcarrier numbers, and forms serial signals.

Figure 5:
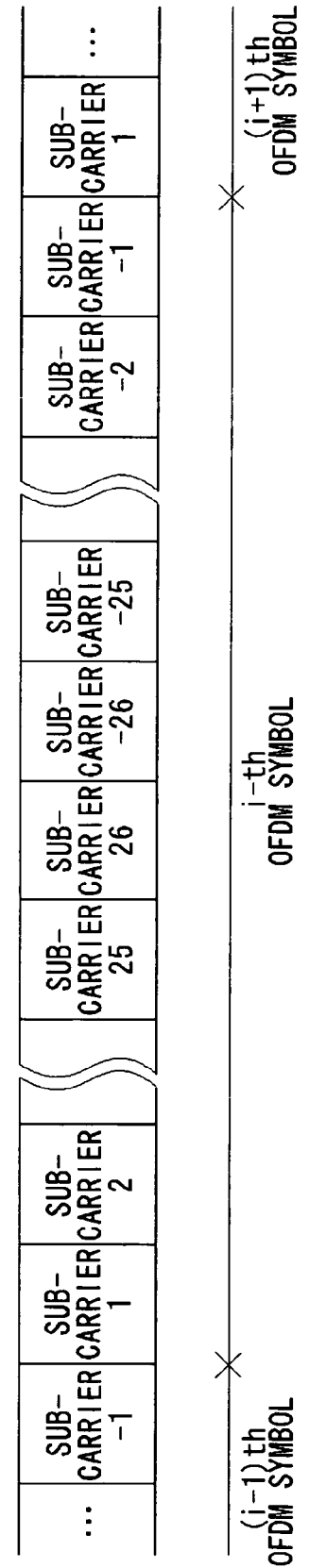
FIG. 5 illustrates a structure of a frequency-domain signal in FIG. 4.

FIG. 5 illustrates a structure of a frequency-domain signal. Assume herein that a combination of subcarrier numbers "−26" to "26" shown in FIG. 1 constitutes an "OFDM symbol". An "i"th OFDM symbol is such that subcarrier numbers "1" to "26" and subcarrier numbers "−26" to "−1" are arranged in this order. Assume also that an "i−1"th OFDM symbol is placed immediately before the "i"th OFDM symbol, and an "i+1"th OFDM symbol is placed immediately after the "i"th OFDM symbol.

Refer back to FIG. 4. The demodulation unit 24 demodulates and decodes the frequency-domain signal 202 outputted from the processing unit 22. The demodulation and decoding are carried out per subcarrier. The demodulation unit 24 outputs the decoded signal to the IF unit 26. The IF unit 26 combines the signals outputted from a plurality of demodulation units 24 so as to form a data stream. Then the IF unit 26 outputs the data stream. The control unit 30 carries out the processings described as above. The control unit 30 controls also the timing in the receiving apparatus 80.

In terms of hardware, this structure can be realized by a CPU, a memory and other LSIs of an arbitrary computer. In terms of software, it is realized by memory-loaded programs which have communication functions or the like, but drawn and described herein are function blocks that are realized in cooperation with those. Thus, it is understood by those skilled in the art that these function blocks can be realized in a variety of forms such as by hardware only, software only or the combination thereof.

Figure 6:
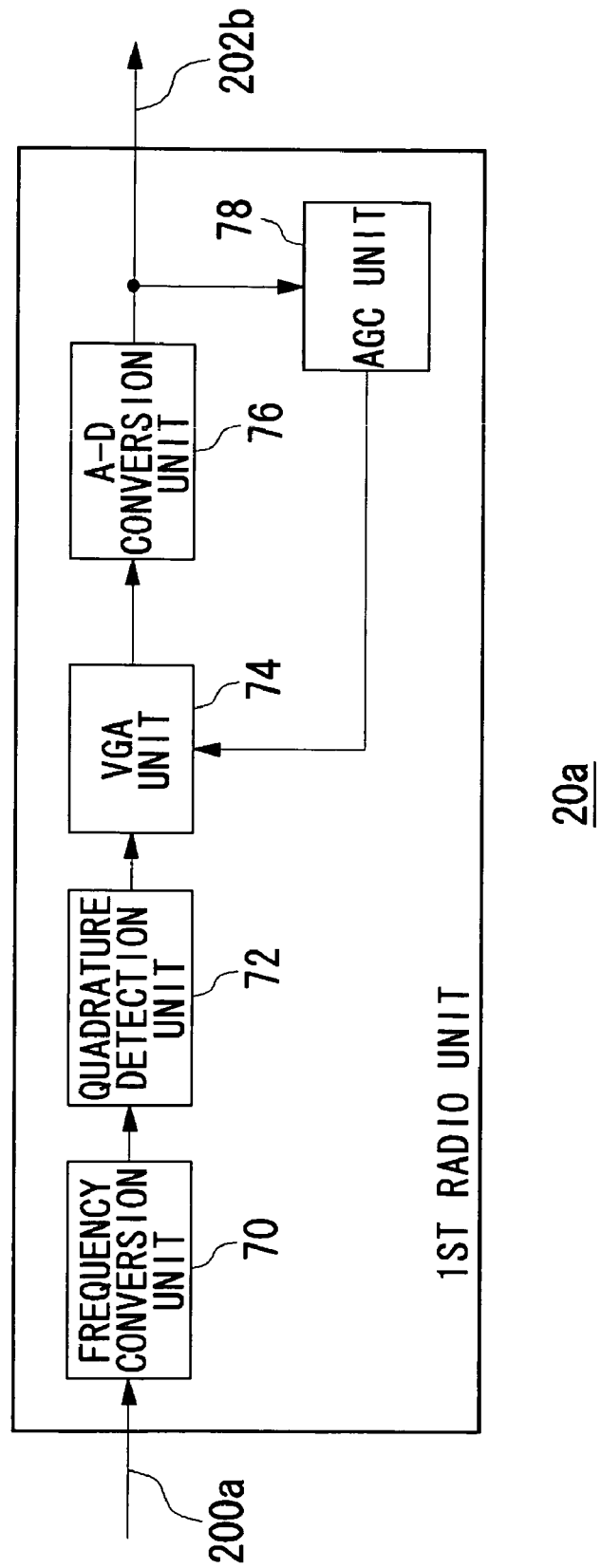
FIG. 6 illustrates a structure of a first radio unit shown in FIG. 4.

FIG. 6 illustrates a structure of a first radio unit 20a. The first radio unit 20a includes a frequency conversion unit 70, a quadrature detection unit 72, a VGA (Variable Gain Amplifier) unit 74, an A-D conversion unit 76 and an AGC unit 78. The radio unit 20 is also provided with a function to measure the signal strength. The measured signal strength is outputted to the control unit 30, not shown.

The frequency conversion unit 70 performs frequency conversion, on the signals to be processed, between the 5 GHz band of radio-frequency and the intermediate frequency. The quadrature detection unit 64 performs quadrature detection on the intermediate frequency signals so as to generate baseband analog signals. The VGA unit 74 amplifies the baseband analog signals by a gain determined by the AGC unit 78. Before the gain is determined, the baseband analog signals are amplified by a tentative gain. The A-D conversion unit 76 converts the baseband analog signal into a digital signal, and outputs the digital signal as the first frequency-domain signal 202*a*. The AGC unit 78 carries out the aforementioned first- to third-stage processings.

It is assumed herein that the start and end timings of the first stage, the indication of whether the beamforming has been carried out or not, the number of streams when the beamforming has been done, and the start and end timings of the third stage are received from control unit 30 (not shown). When a gain determined by the other radio units 20 is used, the AGC unit 78 receives the gain from the control unit 30 (not shown). FIG. 7 shows a data structure of a table stored in the AGC unit 78. Referring to FIG. 7, "the number of streams" and the "reduction amount" are associated with each other. The correspondence between them is such that the larger the number of streams, the larger the reduction amount will be. Refer back to FIG. 6. The AGC unit 78 decides on the reduction amount from the number of streams, according to the table of FIG. 7. In so doing, the AGC unit 78 acquires the number of streams, in advance, as discussed earlier. When the period of Legacy STS ends, the AGC unit 78 reduces the tentative gain by a reduction amount. The thus reduced tentative gain is set as an initial value.

A processing in which to determine a tentative gain and a gain by the AGC unit 78 will now be explained. Suppose that the values outputted from the A-D conversion unit 76 are I and Q. The AGC unit 78 computes $(I^2+Q^2)$ and averages them over a predetermined period of time. As a result thereof, the averaged value is denoted by $Ave(I^2+Q^2)$. If an ideal value obtained from the bit width of the A-D conversion unit 76 is denoted by $Ideal(I^2+Q^2)$, the AGC unit 78 derives the variation of a gain or tentative gain in a manner that the difference between the averaged value and the ideal value is multiplied by a predetermined constant C. This processing is expressed by the following equation:

$$\text{Variation}=(\text{Ideal}(I^2+Q^2)-\text{Ave}(I^2+Q^2))\times C$$

The thus derived variation is added to the already derived gain or tentative gain so as to update the gain or tentative gain. In the above processing, the AGC unit 78 starts the updating from the initial value when the gain is amplified.

A case when the AGC unit 78 didn't reduce the tentative gain will now be described. When MIMO-STS starts, the beamforming is also performed in a transmitting apparatus (not shown) and therefore the signal strength generally increases. When the beamformed received signal is amplified by a predetermined gain, the possibility that the amplified signal saturates increases. As a result thereof, the $Ave(I^2+Q^2)$ saturates and remains to be the maximum value. Thus, the received signal is no longer proportional to $(I^2+Q^2)$ and therefore the difference between the maximum value and the ideal value becomes constant. Finally, it becomes difficult to adjust the gain based on the aforementioned variation. The AGC unit 78 lowers the occurrence probability of this situation by reducing the tentative gain.

Figure 8:
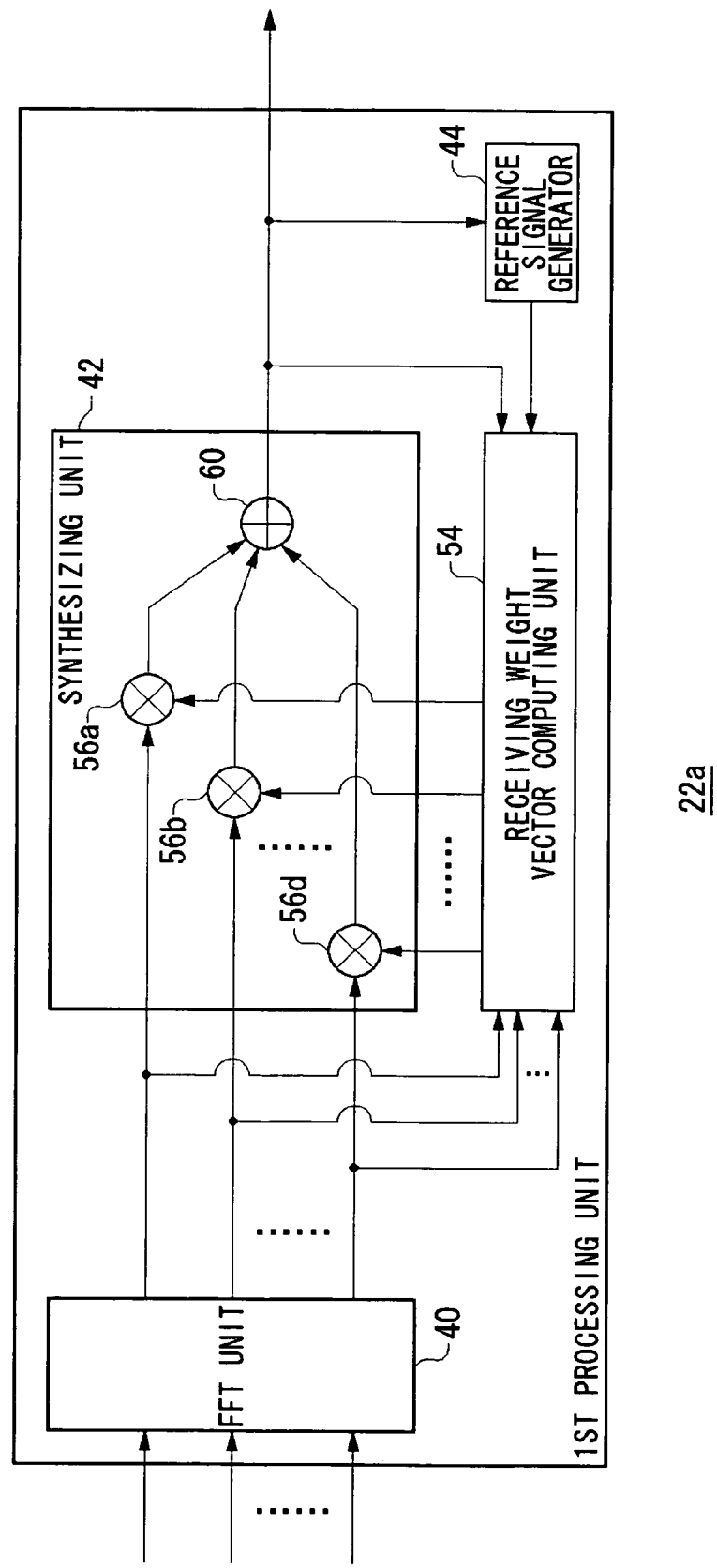
FIG. 8 illustrates a structure of a first processing unit shown in FIG. 4.

FIG. 8 illustrates a structure of a first processing unit 22*a*. The first processing unit 22*a* includes an FFT (Fast Fourier Transform) unit 40, a synthesizing unit 42, a reference signal generator 44 and a receiving weight vector computing unit 54. The synthesizing unit 42 includes a first multiplier 56*a*, a second multiplier 56*b*, . . . and a fourth multiplier 56*d*, which are generically referred to as "multiplier 56", and an adder 60.

The FFT unit 40 receives the input of a plurality of time-domain signals 200 and performs Fourier transform on the respective signals 200 so as to derive frequency-domain signals. As described earlier, the signals corresponding to the subcarriers are arranged serially as one frequency-domain signal.

The multipliers 56 weight the frequency-domain signals with the receiving weight vectors from the receiving weight vector computing unit 54, and the adder 60 sums up the outputs of the multipliers 56. Here, since the frequency-domain signals are arranged in the order of subcarrier numbers, the receiving weight vectors from the receiving weight vector computing unit 54 are also arranged correspondingly to the order of subcarrier numbers. That is, a multiplier 56 inputs successively the receiving weight vectors arranged in the order of subcarrier numbers. Accordingly, the adder 60 sums up multiplication results on a subcarrier-by-subcarrier basis. As a result, the summed-up signals are serially arranged in the order of subcarrier numbers as shown in FIG. 5. A summed-up signal is the aforementioned frequency-domain signal 202.

In the following explanation, if the signal to be processed corresponds to the frequency-domain, the processing therefor is basically executed subcarrier by subcarrier, too. For the brevity of explanation, the processing for one subcarrier will be described herein. Hence, the processing for a plurality of subcarriers will be accommodated in a manner such that the processing for a single subcarrier is executed in parallel or serially.

During the periods of "Legacy STS", "Legacy LTS", "First MIMO-STS" and "First MIMO-LTS", the reference signal generator 44 outputs, as reference signals, "Legacy STS", "Legacy LTS", "First MIMO-STS" and "First MIMO-LTS" which have been stored beforehand. During the periods other than these periods, the frequency-domain signal 202 is determined by a predefined threshold value, and its result is outputted as a reference signal. It is to be noted that the decision may be a soft decision instead of the hard decision.

The receiving weight vector computing unit 54 derives receiving weight vectors, based on the frequency-domain signal outputted from the FFT unit 40, the frequency-domain signal 202 and the reference signal. A method for deriving the receiving weight vectors may be arbitrary. One such a method is the derivation by an LMS (Least Mean Square) algorithm. The receiving weight vectors may be derived by a correlation processing. When a correlation processing is carried out, the frequency-domain signal and the reference signal will be inputted from not only the first processing unit 22*a* but also the second processing unit 22*b* and the like via a signal line (not shown). If a frequency-domain signal in the first processing unit 22*a* is denoted by $x_1(t)$, a frequency-domain signal in the second processing unit 22*b* by $x_2(t)$, a reference signal in the first processing unit 22*a* by $S_1(t)$ and a reference signal in the second processing unit 22*b* by $S_2(t)$, then $x_1(t)$ and $x_2(t)$ will be expressed by the following Equation (5):

$$x_1(t)=h_{11}S_1(t)+h_{21}S_2(t)$$

$$x_2(t)=h_{12}S_1(t)+h_{22}S_2(t) \quad (5)$$

It is assumed here that the number of antennas 12 and the number of antennas 14 are "2" each. The noise is ignored here. A first correlation matrix $R_1$, with E as an ensemble average, is expressed by the following Equation (6):

$$R_1 = \begin{bmatrix} E[x_1 S_1^*] & E[x_1 S_1^*] \\ E[x_2 S_2^*] & E[x_2 S_2^*] \end{bmatrix} \quad (6)$$

A second correlation matrix $R_2$ among the reference signals is given by the following Equation (7):

$$R_2 = \begin{bmatrix} E[S_1 S_1^*] & E[S_1 S_2^*] \\ E[S_2 S_1^*] & E[S_2 S_2^*] \end{bmatrix} \quad (7)$$

Finally, the first correlation matrix $R_1$ is multiplied by the inverse matrix of the second correlation matrix $R_2$ so as to derive a receiving response vector, which is expressed by the following Equation (8):

$$\begin{bmatrix} h_{11} & h_{21} \\ h_{12} & h_{22} \end{bmatrix} = R_1 R_2^{-1} \quad (8)$$

Then the receiving weight vector computing unit 54 computes a receiving weight vector from the receiving response vector.

Figure 9:
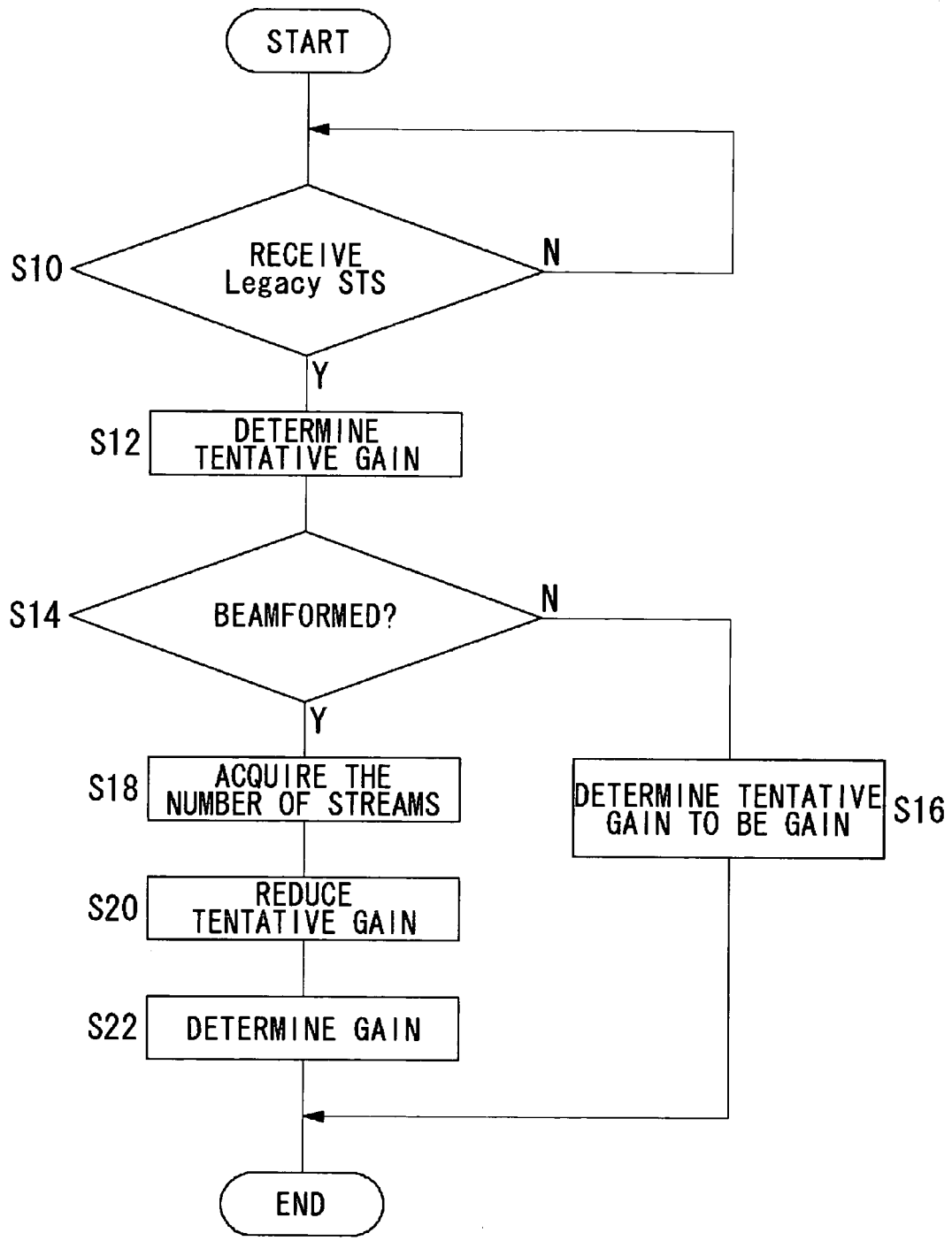
FIG. 9 is flowchart showing a procedure for determining a gain in the receiving apparatus shown in FIG. 4.

An operation of a communication system 100 that employs the structure described as above will now be explained. FIG. 9 is flowchart showing a procedure for determining a gain in a receiving apparatus 80. If the receiving apparatus 80 does not receive Legacy STS (N of S10), the receiving apparatus 80 stands ready until Legacy STS is received. If, on the other hand, Legacy STS is received (Y of S10), an AGC unit 78 determines a tentative gain (S12). It is assumed here that one of the AGC units 78 included in a plurality of radio units 20 is selected by a control unit 30, based on the strength of received signals. If, through information contained in MIMO-STS, the control unit 30 does not detect that the beamforming is to be carried out (N of S14), the AGC unit 78 determines the tentative gain to be a gain (S16).

A VGA unit 74 amplifies a signal by the thus determined gain. If, on the other hand, through information contained in MIMO SIGNAL the control unit 30 detects that the beamforming is to be carried out (Y of S14), the control unit 30 acquires the number of streams through the information contained in MIMO SIGNAL (S18). The AGC unit 78 reduces the tentative gain in accordance with the acquired number of streams (S20). The VGA unit 74 amplifies Legacy STS and MIMO SIGNAL by the tentative gain. With the reduced tentative gain as an initial value, the AGC unit 78 determines a gain (S22). The VGA unit 74 amplifies signals by the determined gain.

Figure 10:
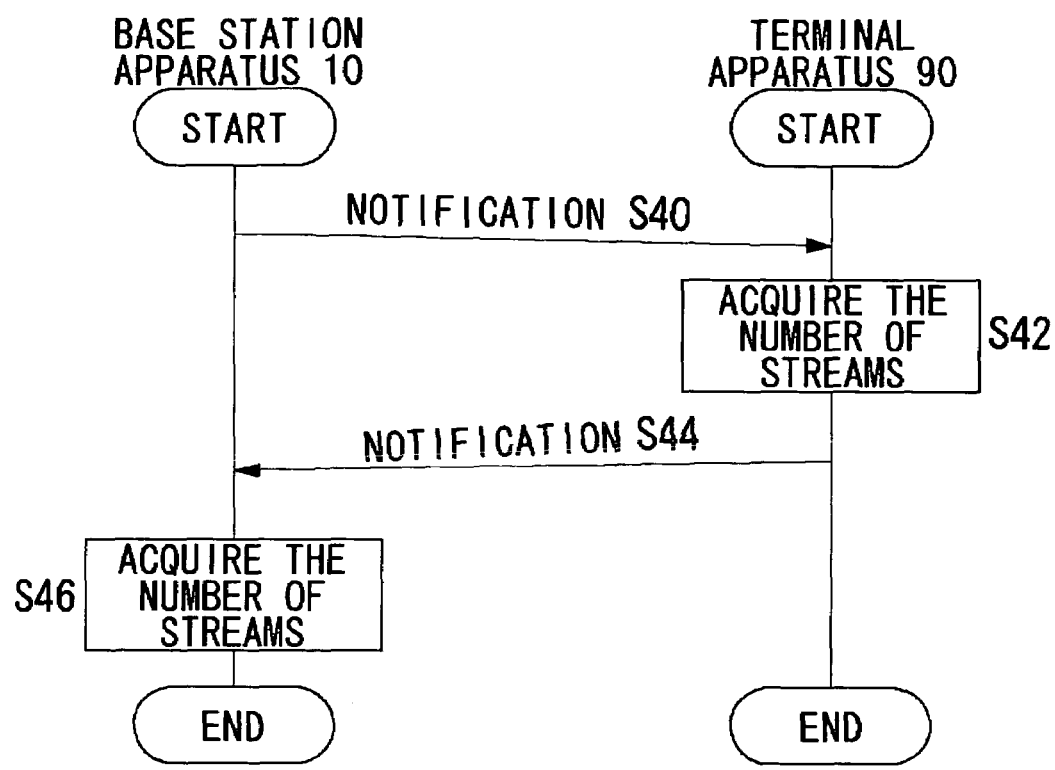
FIG. 10 is a sequence diagram showing a procedure for conveying the number of streams in the communication system shown in FIG. 2.

In the above embodiments, the receiving apparatus 80 acquires the number of streams from the information contained in MIMO SIGNAL. However, the method for acquiring the number of streams is not limited thereto and, for example, the information on the number of streams may be contained in a DATA portion of burst signal and such a burst signal containing the information may be transmitted. FIG. 10 is a sequence diagram showing a procedure for conveying the number of streams in a communication system 100. A base station apparatus 10 transmits a burst signal so as to convey the number of streams (S40). A terminal apparatus 90 acquires the number of streams from the burst signal (S42). The terminal apparatus 90 transmits a burst signal so as to convey the number of streams (S44). The base station apparatus 10 acquires the number of streams from the burst signal (S46).

Figure 11:
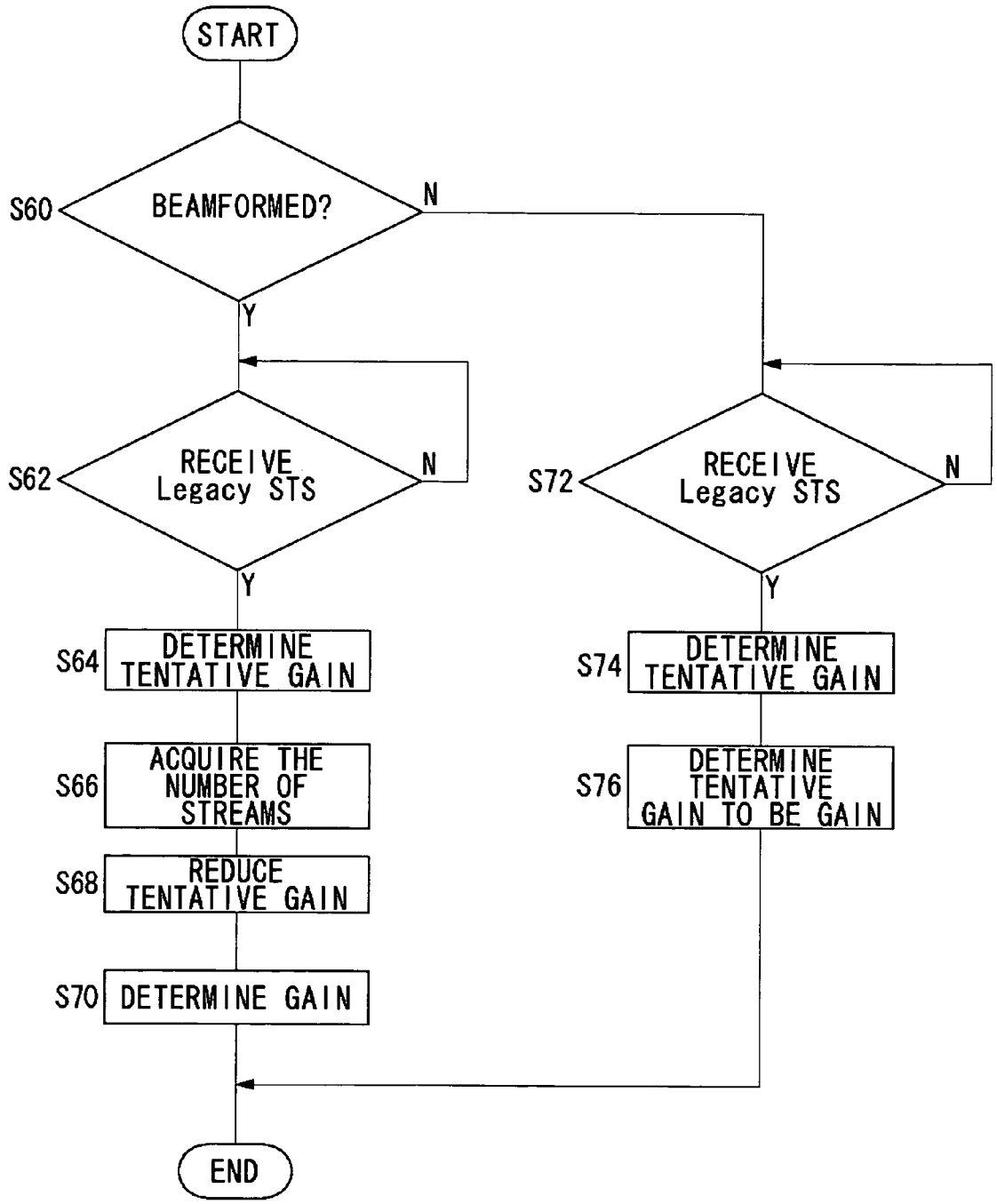
FIG. 11 is a flowchart showing a procedure for determining a gain in the receiving apparatus shown in FIG. 4.

A modification to the determination of gain as shown in FIG. 9 will now be described. In this modification, a signal containing information indicative of a schedule of beamforming execution is transmitted beforehand. That is, a negotiation, for beamforming, between the base station apparatus 10 and the terminal apparatus 90 is conducted. Accordingly, the receiving apparatus 80 included in the base station apparatus 10 or terminal apparatus 90 recognizes, prior to receiving the burst signal, whether beamforming is to be executed or not. It is to be noted that information on a period during which beamforming is executed may be contained in the information indicative of a schedule of beamforming execution. In such a case, the receiving apparatus 80 recognizes the period during which beamforming is executed, based on said information, and continues, during said period, the aforementioned operation of reducing the gain. FIG. 11 is a flowchart showing another procedure for determining a gain in a receiving apparatus 80. The control unit 30 detects, through the signal received beforehand, that beamforming is to be executed (Y of S60). If the receiving apparatus 80 does not receive Legacy STS (N of S62), the receiving apparatus 80 stands ready until Legacy STS is received.

If, on the other hand, Legacy STS is received (Y of S62), the AGC unit 78 determines a tentative gain (S64). It is assumed here that one of the AGC units 78 included in a plurality of radio units 20 is selected by the control unit 30, based on the strength of received signals. The control unit 30 acquires the number of streams through the information contained in MIMO SIGNAL (S66). The AGC unit 78 reduces the tentative gain in accordance with the acquired number of streams (S68). With the reduced tentative gain as an initial value, the AGC unit 78 determines a gain (S70). The VGA unit 74 amplifies signals by the determined gain.

On the other hand, if, through the signal received beforehand, the control unit 30 does not detect that the beamforming is to be executed (N of S60) and the receiving apparatus 80 does not receive Legacy STS (N of S72), then the control unit 30 stands ready until Legacy STS is received. If, on the other hand, Legacy STS is received (Y of S72), the AGC unit 78 determines a tentative gain (S74). The AGC unit 78 determines the tentative gain to be a gain (S76). The VGA unit 74 amplifies a signal by the thus determined gain.

According to the embodiments of the present invention, the tentative gain is reduced before a gain is determined with the reduced tentative gain as an initial value. Thus, the signal is unlikely to saturate at the time of determining gain, so that the change in signal to be processed can be accurately detected. Since the change in strength of signal can be accurately detected, gain in response to the change can be determined. Since gain in response to the change in strength can be determined, the error contained in the gain can be reduced. After the tentative gain has been determined over a period of Legacy STS, gain is determined, with the reduced tentative gain as an initial value, over a period of MIMO-STS. Hence, the total period for which the gain is determined can be made longer. Since the total period for which the gain is determined can be made longer, the error contained in the gain can be reduced. Since the cross-correlation among MIMO-LTSs is so defined as to be smaller than the cross-correlation among Legacy STSs assigned respectively to a plurality of streams, the error contained in the tentative gain can be reduced in the finally determined gain.

Even in the case when beamforming is executed on MIMO-STS and a signal placed posterior to this MIMO-STS, the possibility that signals saturate can be made small by reducing the tentative and therefore the error contained in gain can be made small. The increase, in signal strength, due to the beamforming can be estimated by the tentative gain. Since the execution of beamforming can be detected before the beamforming is started, the error contained in gain can be made smaller in accordance with the strength of signals to be received. As the number of streams increases, the signal strength is likely to increase. Hence, the accuracy of the initial values can be enhanced by raising the reduction amount. Even in the case when the period of MIMO-STS is shorter than that of Legacy STS, gain is determined using the both of them and therefore the error contained in gain can be made smaller.

The present invention has been described based on the embodiments which are only exemplary. It is therefore understood by those skilled in the art that other various modifications to the combination of each component and process of the embodiments described above are possible and that such modifications are also within the scope of the present invention.

In the present embodiments described above, the description has been made on the assumption that the communication system 100 uses the OFDM modulation scheme. However, the present invention is not limited thereto, and the communication system 100 may use a single-carrier method. According to this modification, the present invention can be applied to various kinds of communication systems. That is, it suffices as long as a communication system which performs beamforming by a plurality of antennas is used.

In the present embodiments described above, the description has been made in conjunction with a communication system in which MIMO system is adapted. However, the present invention is not limited thereto and, for example, may be applied to a case where signals transmitted from a single antenna are received by the antenna 16. Also, the present invention may be applied to a case where beamforming is no longer executed from in the middle of a burst signal. In such a case, too, the possibility that signals saturate can be made small by determining the gain in the three divided stages, and therefore the error contained in gain can be made small. That is, it is only necessary that the known signals be assigned in two or more separated parts.

In the present embodiments described above, one of a plurality radio units 20 is chosen to operate. However, a structure is not limited thereto and, for example, a plurality of AGC units 78 may operate and the signals corresponding respectively thereto may be amplified by the gains. Furthermore, even in the case when a single AGC unit 78 operates as in the present embodiments, the AGC unit 78 which is supposed to operate may be determined in advance. According to this modification, various kinds of operations may be implemented as the operation of the AGC unit 78. That is, it suffices if a plurality of signals are amplified.

While the preferred embodiments of the present invention have been described using specific terms, such description is for illustrative purposes only, and it is to be understood that changes and variations may be made without departing from the spirit or scope of the appended claims.

What is claimed is:

1. A receiving apparatus, comprising:
a receiver which receives a burst signal;
a decision unit which determines a gain for the burst signal received by said receiver;
an amplifier which amplifies the burst signal received by said receiver, by the gain determined by said decision unit; and
a processing unit which processes the burst signal amplified by said amplifier,
wherein, in the burst signal received by said receiver, a first known signal is assigned in a header portion whereas a second known signal is assigned posterior to the first known signal, and an interval of the second known signal is shorter than that of the first known signal, and
wherein said decision unit includes a means which determines a tentative gain in the first known signal, a means which reduces said tentative gain, and a means which determines a gain in the second known signal with the reduced tentative gain as an initial value.

2. A receiving apparatus, comprising:
a receiver which receives a burst signal;
a decision unit which determines a gain for the burst signal received by said receiver;
an amplifier which amplifies the burst signal received by said receiver, by the gain determined by said decision unit; and
a processing unit which processes the burst signal amplified by said amplifier,
wherein, in the burst signal received by said receiver, a first known signal is assigned in a header portion whereas a second known signal is assigned posterior to the first known signal,
wherein said decision unit includes a means which determines a tentative gain in the first known signal, a means which reduces said tentative gain, and a means which determines a gain in the second known signal with the reduced tentative gain as an initial value,
said receiver receives burst signals by a plurality of antennas, the burst signal is composed of a plurality of streams, and at the same time a cross-correlation among the second known signals assigned respectively to the plurality of streams is so defined as to be smaller than a cross-correlation among the first known signals assigned respectively to the plurality of streams,
wherein said decision unit determines a gain for the burst signals received by said receiver via the plurality of antennas,
and
wherein said amplifier amplifies the burst signals received by the plurality of antennas.

3. A receiving apparatus according to claim 2, further comprising an acquiring unit which acquires the number of a plurality of streams, wherein said decision unit determines a degree of reducing the tentative gain, in accordance with the number of a plurality of streams acquired by said acquiring unit.

4. A receiving apparatus, comprising:
a receiver which receives a burst signal;
a decision unit which determines a gain for the burst signal received by said receiver;
an amplifier which amplifies the burst signal received by said receiver, by the gain determined by said decision unit; and
a processing unit which processes the burst signal amplified by said amplifier,
wherein, in the burst signal received by said receiver, a first known signal is assigned in a header portion whereas a second known signal is assigned posterior to the first known signal,
wherein said decision unit includes a means which determines a tentative gain in the first known signal, a means which reduces said tentative gain, and a means which determines a gain in the second known signal with the reduced tentative gain as an initial value,
wherein said receiver receives burst signals by a plurality of antennas, at least a second known signal and a signal posterior thereto in the burst signals are each composed of a plurality of streams, and at the same time the second known signal and the signal posterior thereto are beamformed, wherein said decision unit determines a gain for the burst signals received by said receiver via the plurality of antennas, and wherein said amplifier amplifies the burst signals received by said receiver via the plurality of antennas.

5. A receiving apparatus according to claim 4, wherein said receiver receives beforehand a signal containing information indicative of a schedule of beamforming execution, and wherein when the signal containing information indicative of a schedule of beamforming is received by said receiver, said decision unit reduces the tentative gain.

6. A receiving apparatus according to claim 4, wherein information indicative of a schedule of beamforming execution is assigned between the first known signal and the second known signal, in the burst signal received-by said receiver via the plurality of antennas, and wherein when beamforming execution is detected from the information, said decision unit reduces the tentative gain.

7. A receiving apparatus according to claim 4, further comprising an acquiring unit which acquires the number of a plurality of streams, wherein said decision unit determines a degree of reducing the tentative gain, in accordance with the number of a plurality of streams acquired by said acquiring unit.

8. A receiving method, including:
receiving a radio-frequency burst signal by a receiving apparatus;
determining a gain for the burst signal received; amplifying the received burst signal by the gain determined by said determining; and
generating a demodulated signal by demodulating the amplified burst signal,
wherein, in the burst signal received in said receiving, a first known signal is assigned in a header portion whereas a second known signal is assigned posterior to the first known signal, and an interval of the second known signal is shorter than that of the first known signal, and
wherein said determining includes determining a tentative gain in the first known signal, reducing said tentative gain, and determining a gain in the second known signal with the reduced tentative gain as an initial value.

9. A receiving method, including:
receiving a radio-frequency burst signal by a receiving apparatus;
determining a gain for the burst signal received;
amplifying the received burst signal by the gain determined by said determining; and
generating a demodulated signal by demodulating the amplified burst signal,
wherein, in the burst signal received in said receiving, a first known signal is assigned in a header portion whereas a second known signal is assigned posterior to the first known signal, and
wherein said determining includes determining a tentative gain in the first known signal, reducing said tentative gain, and determining a gain in the second known signal with the reduced tentative gain as an initial value,
wherein said receiving is such that burst signals are received by a plurality of antennas, the burst signal is composed of a plurality of streams, and at the same time a cross-correlation among the second known signals assigned respectively to the plurality of streams is so defined as to be smaller than a cross-correlation among the first known signals assigned respectively to the plurality of streams,
wherein in said determining a gain for the burst signals received by the plurality of antennas is determined, and
wherein in said amplifying the burst signals received by the plurality of antennas are amplified.

10. A receiving method according to claim 9, further comprising acquiring the number of a plurality of streams, wherein said determining determines a degree of reducing the tentative gain, in accordance with the number of a plurality of streams acquired in said acquiring.

11. A receiving method, including:
receiving a radio-frequency burst signal by a receiving apparatus;
determining a gain for the burst signal received;
amplifying the received burst signal by the gain determined by said determining; and
generating a demodulated signal by demodulating the amplified burst signal,
wherein, in the burst signal received in said receiving, a first known signal is assigned in a header portion whereas a second known signal is assigned posterior to the first known signal, and
wherein said determining includes determining a tentative gain in the first known signal, reducing said tentative gain, and determining a gain in the second known signal with the reduced tentative gain as an initial value,
wherein said receiving is such that burst signals are received by a plurality of antennas, at least a second known signal and a signal posterior thereto in the burst signals are each composed of a plurality of streams, and at the same time the second known signal and the signal posterior thereto are beamformed,
wherein in said determining a gain for the burst signals received by the plurality of antennas is determined, and
wherein in said amplifying the burst signals received by the plurality of antennas are amplified.

12. A receiving method according to claim 11, wherein said receiving receives beforehand a signal containing information indicative of a schedule of beamforming execution, and when the signal containing information indicative of a schedule of beamforming is received, said determining reduces the tentative gain.

13. A receiving method according to claim 11, wherein information indicative of a schedule of beamforming execution is assigned between the first known signal and the second known signal, in the burst signal received in said receiving via the plurality of antennas, and wherein when beamforming execution is detected from the information, said determining reduces the tentative gain.

14. A receiving method according to claim 11, further comprising acquiring the number of a plurality of streams, wherein said determining determines a degree of reducing the tentative gain, in accordance with the number of a plurality of streams acquired in said acquiring.

* * * * *